United States Patent [19]

Tomisawa et al.

[11] Patent Number: 5,043,984
[45] Date of Patent: Aug. 27, 1991

[54] METHOD AND SYSTEM FOR INSPECTING MICROPROCESSOR-BASED UNIT AND/OR COMPONENT THEREOF

[75] Inventors: Naoki Tomisawa; Yukio Hoshino; Masashi Fukushima; Toru Hamada, all of Gunma, Japan

[73] Assignee: Japan Electronic Control Systems Co., Ltd., Isezaki, Japan

[21] Appl. No.: 180,517

[22] Filed: Apr. 12, 1988

[30] Foreign Application Priority Data

Apr. 14, 1987 [JP] Japan ............................ 62-89850
Apr. 28, 1987 [JP] Japan ............................ 62-103222

[51] Int. Cl.⁵ .................. G06F 11/30; G06F 11/22
[52] U.S. Cl. ................................... 371/16; 371/24; 371/25.1
[58] Field of Search ............... 371/16, 17, 20, 24, 371/27, 25.1, 16.1, 16.4; 324/184, 185, 186, 431.04, 431.11

[56] References Cited

U.S. PATENT DOCUMENTS

| 4,249,238 | 2/1981 | Spang | 364/185 X |
| 4,409,635 | 10/1983 | Kraus | 371/16 X |
| 4,649,537 | 3/1989 | Rosswurm | 371/16 |
| 4,683,420 | 7/1987 | Goutzoulis | 371/16 X |

FOREIGN PATENT DOCUMENTS

EP0144226 9/1985 European Pat. Off. .
WO810047 10/1981 PCT Int'l Appl. .
2046964 8/1980 United Kingdom .

Primary Examiner—Robert W. Beausoliel
Attorney, Agent, or Firm—Pennie & Edmonds

[57] ABSTRACT

An inspection device is provided an inspection parameter generator generating predetermined parameter data. The parameter data is transmitted to a control unit subjecting inspection. The inspection device receives input signal from the control unit, which input signal corresponds to the parameter data input to the control unit. Both of the control unit and inspection device processes the corresponding data. The control unit feeds resultant output to the inspection device. The inspection device compares its own resultant data and the resultant output of the control unit to make judgment whether the control unit operates in normal condition or not.

28 Claims, 5 Drawing Sheets

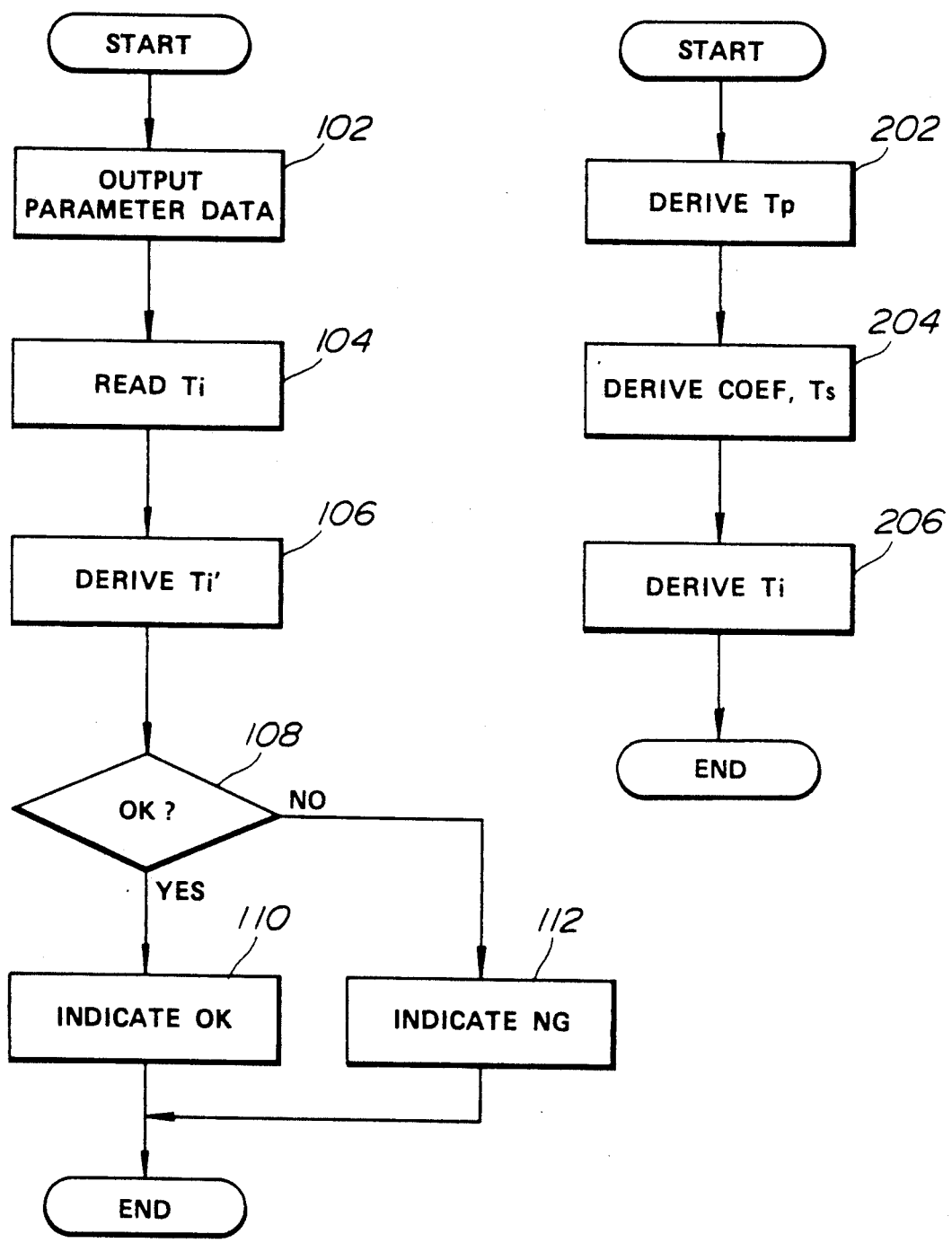

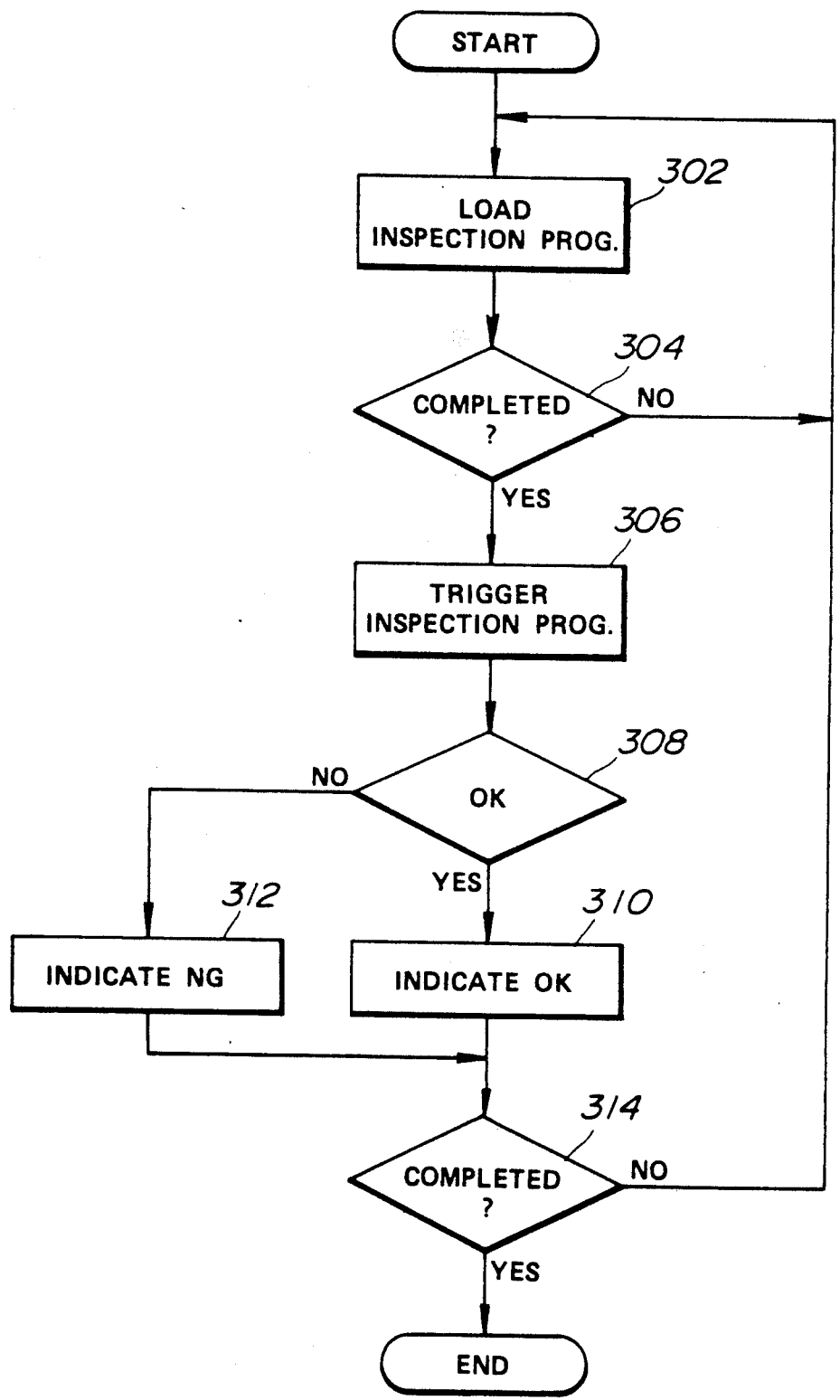

METHOD AND SYSTEM FOR INSPECTING MICROPROCESSOR-BASED UNIT AND/OR COMPONENT THEREOF

BACKGROUND OF THE INVENTION

1. Field of the Invention

The present invention relates generally to a method and a system for inspecting a microprocessor-based unit or component thereof. More specifically, the invention relates to a method and system for inspecting a microprocessor containing control unit, which as an automotive device control unit, such as an engine control unit, a brake control unit, a suspension control unit and for forth, and particularly for inspecting hardware of the control unit for detecting defective unit.

2. Description of the Background Art

In the recent automotive vehicles, various electronic control units, such as an engine control unit for controlling fuel injection, spark ignition timing and so forth, are installed for optimizing performance of the vehicular devices to be controlled. Such control units have been disclosed in the Japanese Patent First (unexamined) Publication (Tokkai) Showa 61-34334.

In manufacture of such control units, hardware has to be checked or inspected before shipping. Conventionally, one of methods of inspection is to apply a dummy load corresponding to a predetermined condition to the control unit to receive a control signal output from the control unit in response thereto. The control signal is compared with a reference value which represents the control signal value when the control unit operates in normal condition. In another method, an inspection program is installed in the control unit which is also provided with an input port for inputting inspection commands and an output port for outputting data indicative of the result of execution of the inspection program. An externally installed inspection apparatus receives the output of the control unit and compares its with a reference signal to check whether the output from the control unit indicates a normal value as represented by the reference signal.

The former method is economical in the viewpoint of cost. However, in order to check the control unit subjecting inspection, a relatively large number of inspection data are to be processed for obtaining the output to be compared with the reference value. This makes it difficult to identify a faulty component even when a defective control unit is detected. Furthermore, since the control unit must process a large number of data for obtaining the output to be checked, process time in the control unit can be long to require substantially long inspection period for each control unit. This clearly drops the efficiency of inspection. On the other hand, since the latter method is operated by the inspection program installed in the control unit, which uses a program specifically designed for inspection, it becomes easier to troubleshoot a faulty element based on the output. Furthermore, once a special inspection program may be optimized for checking operation of necessary component, process time can be minimized to shorten the inspection period. However, in order to install the inspection program, additional memory area is required and this makes the cost of the control unit expensive.

In addition, in either method, when the specification of the control unit is changed, substantial change of data and process, such as change of program, may become necessary.

SUMMARY OF THE INVENTION

Therefore, it is an object of the invention to provide a method and system to effectively and cheaply perform inspection for a microprocessor-based system, such as a control unit for automotive devices.

In order to accomplish the aforementioned and other objectives, an inspection device is provided with an inspection parameter generator which generates predetermined parameter data. The parameter data is transmitted to a control unit subjecting inspection. The inspection device receives input signal from the control unit, which input signal corresponds to the parameter data input to the control unit. Both the control unit and the inspection device process the corresponding data. The control unit feeds resultant output to the inspection device. The inspection device compares its own resultant data and the resultant output of the control unit to make judgement whether the control unit operates in normal condition or not.

According to one aspect of the invention, an inspection system for a microprocessor based unit comprises first means for storing data to be used for inspection of the microprocessor based unit, second means for reading out the data stored in the storing means and outputting to the read data to the microprocessor based unit for triggering the operation of the microprocessor based unit, third means for reading out an intermediate data which is derived in operation of the microprocessor based unit and deriving a reference data based on the read intermediate data, and fourth means for receiving a resultant data derived through the operation of the microprocessor based unit and comparing the received resultant data with the reference data in order to detect fault of operation of the microprocessor based unit by detecting a difference between the resultant data and the reference data greater than a given value.

The microprocessor based unit forms a control unit to be connected to a control load for outputting a control signal having a value in a known relationship with an input representative of a control parameter, the first means at least stores the data indicative of a given value corresponding to the control parameter, and the third means reads an intermediate data which is derived during the process of derivation of the control signal and having known relationship with the control signal. The microprocessor based unit has an input port to receive therethrough the control parameter, a first output port connected to the control load to output the control signal therethrough, the first means is connected to the input port for inputting the control parameter corresponding data therethrough, the fourth means is connected to the first output port for receiving the control signal therethrough, and the control unit further has a second output port for outputting the intermediate data therethrough, to which the third means is connected to receive therefrom the intermediate data.

The control signal derives a control magnitude of the control load on the basis of the input data input through the input port from the first means and produces the control signal for driving the control for a controlled magnitude based on the control magnitude, and the third means receives a signal indicative of the control magnitude for deriving the reference data representative of a control signal value which is to be derived by the control unit operating in normal condition.

According to another aspect of the invention, an inspection system for a microprocessor based control unit for controlling a predetermined electrically or electronically controlled device based on a predetermined control parameter, comprises first means for storing parameter data corresponding to the control parameter and having a known value, second means for reading out the parameter data stored in the storing means and outputting the read parameter data to the microprocessor based control unit for triggering the latter to perform operation for controlling the control load on the basis of the parameter data, third means for reading out an intermediate data which is derived during operation of the microprocessor based control unit for deriving a control signal, which intermediate data being in known relationship with the control signal to be derived by the microprocessor based control signal, the third means deriving a reference data based on the read intermediate data, fourth means for receiving the control signal from the microprocessor based control unit and comparing the received control signal value with the reference data in order to detect fault of operation of the microprocessor based control unit by detecting a difference between the resultant data and the reference data greater than a given value to produce a fault indicative signal, and fifth means, responsive to the fault indicative signal, for indicative fault of the control signal According to a further aspect of the invention, an inspection system for a microprocessor based unit comprises first means for storing an inspection program to be executed by the microprocessor based unit, and parameter data corresponding to the control parameter and having a known value, which inspection program is so designed as to derive a resultant data in a known relationship with the parameter data, second means for reading the inspection program and loading the read inspection program to the microprocessor based unit, the second means triggering the microprocessor based unit to make it to execute inspection program, second means for outputting the read parameter data, third means for deriving a reference data based on the parameter data, fourth means for receiving the resultant data from the microprocessor based unit and comparing the received resultant data value with the reference data in order to detect fault of operation of the microprocessor based unit by checking relationship between the resultant data and the reference when the relationship is other hand a known relationship, and fifth means, responsive to the fault indicative signal, for indicative fault of the resultant data According to a yet further aspect of the invention, a method for inspecting for a microprocessor based unit comprising the steps of:

setting data to be used for inspection of the microprocessor based unit;

outputting to the data to the microprocessor based unit for triggering the operation of the microprocessor based unit;

reading out an intermediate data which is derived in operation of the microprocessor based unit and deriving a reference data based on the read intermediate data;

receiving a resultant data derived through the operation of the microprocessor based unit; and comparing the received resultant data with the reference data in order to detect fault of operation of the microprocessor based unit by detecting a difference between the resultant data and the reference data greater than a given value.

According to a still further aspect, a method for inspecting a microprocessor based unit comprising the steps of:

setting an inspection program to be executed by the microprocessor based unit, and parameter data corresponding to the control parameter and having a known value, which inspection program is so designed as to derive a resultant data in a known relationship with the parameter data;

reading the inspection program and loading the read inspection program to the microprocessor based unit, the second means triggering the microprocessor based unit to make it to execute inspection program;

outputting the read parameter data;

deriving a reference data based on the parameter data;

receiving the resultant data from the microprocessor based unit and comparing the received resultant data value with the reference data in order to detect fault of operation of the microprocessor based unit by checking relationship between the resultant data and the reference when the relationship is other hand a known relationship; and indicating fault of the microprocessor based unit in response to the fault indicative signal.

BRIEF DESCRIPTION OF THE DRAWINGS

The present invention will be understood more fully from the detailed description given herebelow and from the accompanying drawings of the preferred embodiment of the invention, which, however, should not be taken to limit the invention to the specific embodiment but are for explanation and understanding only.

In the drawings:

FIG. 2 is a flowchart of a program to be executed by an inspection device in the inspection system of FIG. 1, during operation for inspection;

FIG. 3 is a flowchart of a program to be executed by the microprocessor based unit subjecting inspection, during operation for inspection;

FIG. 6 is a flowchart of an inspection program to be executed by an inspection device in the second embodiment of the inspection system of FIG. 4.

DESCRIPTION OF THE PREFERRED EMBODIMENT

Figure 1:
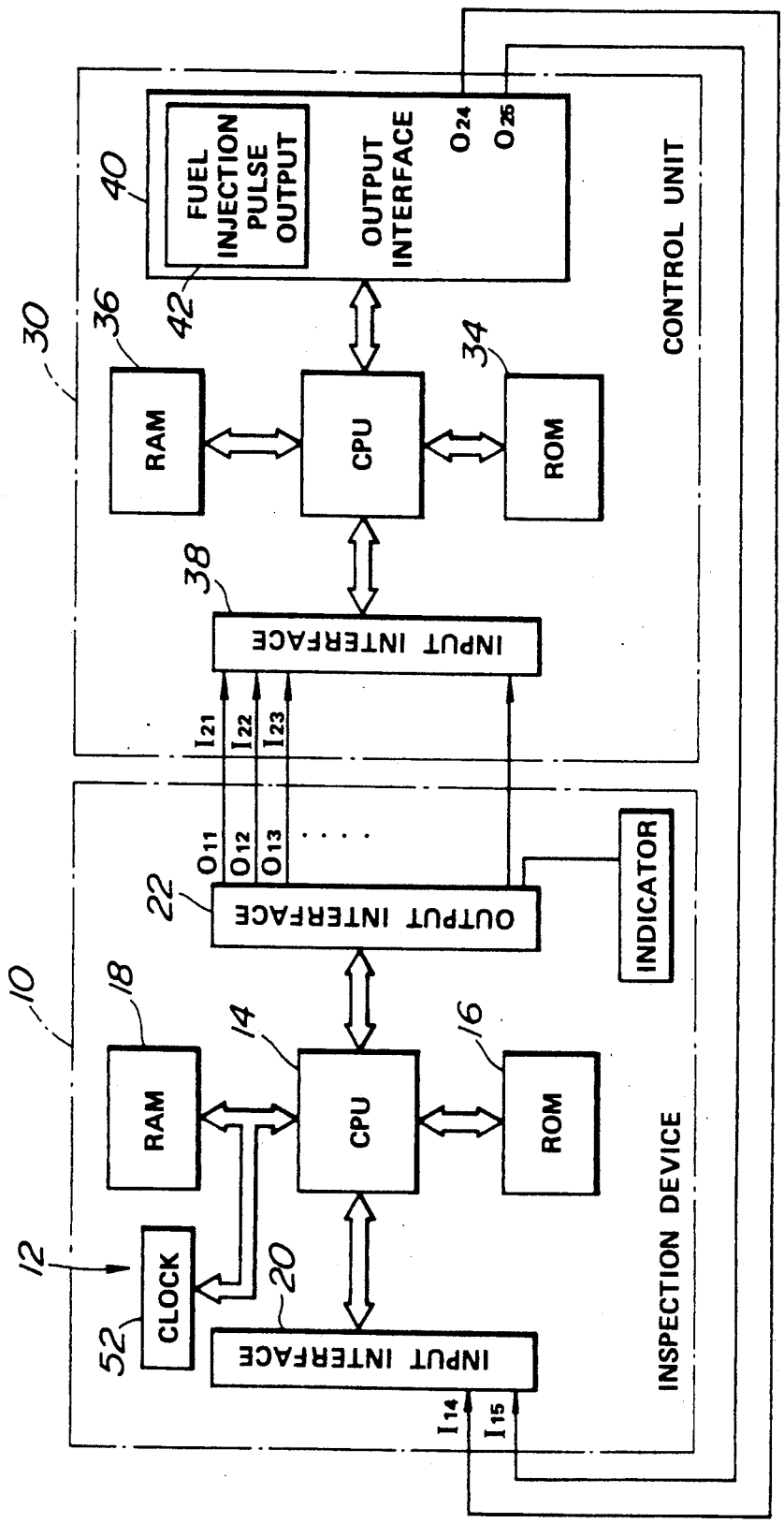
FIG. 1 is a block diagram of the first embodiment of an inspection system of a microprocessor based unit, according to the invention.

Referring now to the drawings, particularly to FIG. 1, the first embodiment of an inspection system and inspection process to be implemented utilizing the inspection system will be discussed herebelow in terms of inspection of a microprocessor based control unit for controlling fuel injection in an internal combustion engine, such as an automotive fuel injection internal combustion engine. Though the specific application of the inspection system and method will be discussed in order to facilitate better understanding of the invention, the invention should not be regarded as limiting to the shown specific application but can be applicable for inspection of any type of microprocessor based units which processes input or inputs for deriving an output having a given relationship with the inputs.

In the first embodiment of FIG. 1, an inspection system generally comprises an inspection device 10 which comprises a microprocessor 12. The microprocessor 12 has CPU 14, ROM 16, RAM 18, input interface 20 and an output interface 22. ROM 16 of the inspection device 10 stores a program which is illustrated in FIG. 3 and will be discussed later. RAM 18 stores inspection data to be used during execution of the inspection program. In the shown embodiment, since a fuel injection control unit 30 is checked, the inspection data stored in RAM 18 represents fuel injection control parameters, e.g. a first parameter data representative of a predetermined engine revolution speed N, a second parameter data representative of a predetermined engine load Q, and a third parameter data representative of a predetermined engine coolant temperature Tw. These first, second and third parameter data may have the data format identical to those which are normally generated by the respective corresponding sensors monitoring the engine driving conditions during actual engine control operation. Therefore, the engine speed N indicative of first parameter data may be in a form of a predetermined frequency and pulse width of pulse train corresponding a crank reference signal or a crank position signal which may be input from a crank angle sensor in actual control. Similarly, the engine load Q indicative of second parameter data may be an analog signal of a predetermined voltage representative of a predetermined engine load indicative value Q, which analog signal corresponds to that to be generated by an air flow meter or an intake vacuum sensor in the actual control. The engine coolant temperature Tw indicative of third parameter data may be also in a form of a predetermined voltage of analog signal corresponding to that to be generated by an engine coolant temperature sensor in the actual control. The output interface 22 of the inspection device 10 has output ports $O_{11}$, $O_{12}$, $O_{13}$ . . . for outputting inspection data therethrough.

On the other hand, a control unit 30 generally comprises a microprocessor which includes CPU 32, ROM 34, RAM 36, an input interface 38 and an output interface 40. ROM 34 stores a fuel injection pulse setting program for performing fuel injection control. The input interface 38 has a plurality of input ports $I_{21}$, $I_{22}$, $I_{23}$ . . . The output ports $O_{11}$, $O_{12}$ and $O_{13}$ of the output interface 22 is connected to the input ports $I_{21}$, $I_{22}$ and $I_{23}$ of the control unit 30. In the shown construction, the input port $I_{21}$ of the control unit 30 is provided for receiving the engine speed indicative data N. Therefore, in the actual installation to the engine, the input port $I_{21}$ is connected the engine speed indicative data N source, such as a crank angle sensor. Likewise, the input port $I_{22}$ is designed to receive the engine load data Q and thus is connected to the engine load data source, such as an air flow meter, intake vacuum sensor. Likewise, the input port $I_{23}$ is designed to be connected to the engine coolant temperature sensor to receive therefrom the engine coolant temperature indicative signal in the actual installation.

In the practical embodiment, the engine speed N indicative third parameter data is output through the output port $O_{11}$ of the inspection device 10 and thus input to the input port $I_{21}$ of the control unit. Similarly, the engine load Q indicative second parameter data is transferred from the output port $O_{12}$ to the input port $I_{22}$. Furthermore, the engine coolant temperature Tw indicative third parameter data is transferred from the output port $O_{13}$ to the input port $I_{23}$.

Figure 4:
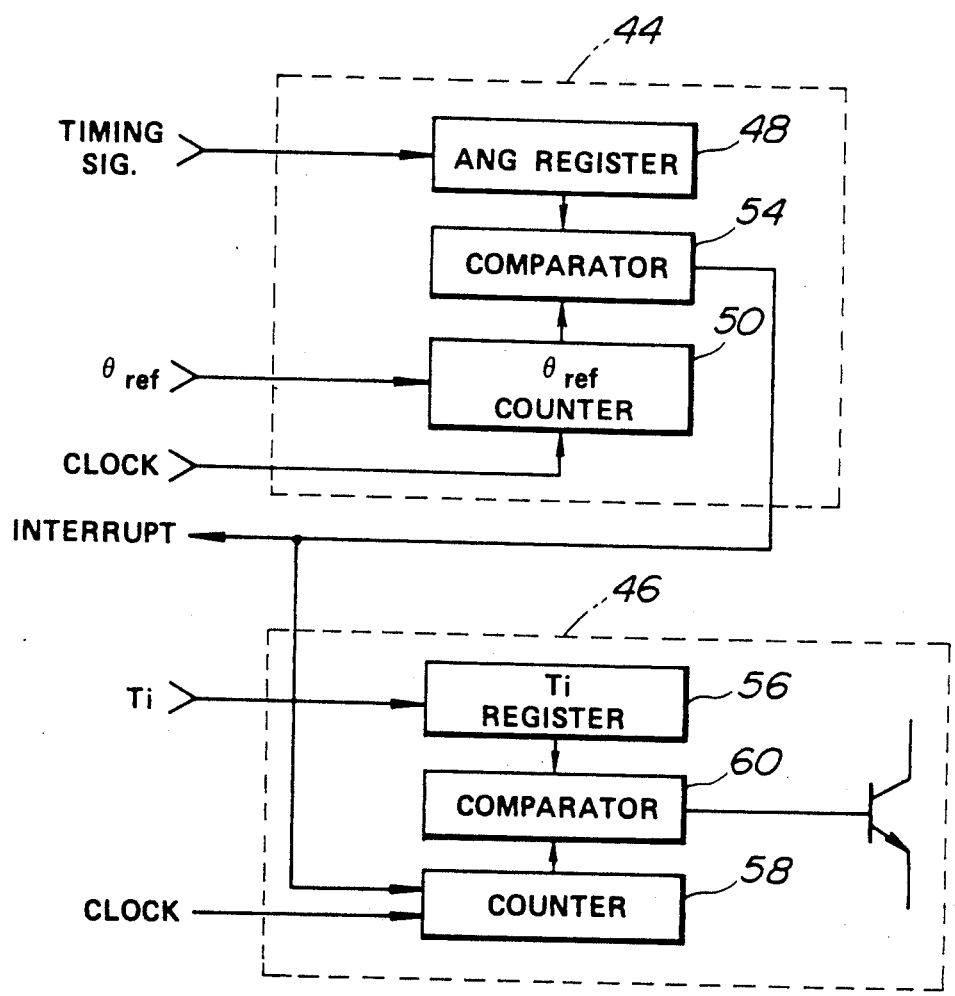
FIG. 4 is a block diagram of a fuel injection pulse generator section in an output interface of a control unit to be subject inspection.

The output interface 40 of the control unit 30 has an output port $O_{24}$ to output therethrough a fuel injection amount indicative data Ti as a resultant value of execution of the fuel injection control program of FIG. 3. This output port $O_{24}$ is connected to an input port $I_{14}$ of the input interface 20 of the inspection device 10. The output interface 40 of the control unit 30 also has a fuel injection pulse generator section 42 to which the fuel injection amount indicative data Ti is to be set. Practically, the fuel injection pulse generator section 42 comprises a fuel injection timing control stage 44 and a fuel injection pulse outputting stage 46, as shown in FIG. 4. The fuel injection timing control stage 44 includes a register 48 to be the fuel injection timing indicative data which representative of a fuel injection start timing derived through fuel injection control operation to be performed by the control unit in a known process, is to be set, which register will be hereafter referred to as "ANG register", a clock counter 50 which is connected to a clock generator 52 to count up clock pulses delivered therefrom, and a comparator 54 which compares the counter value of the clock counter 50 with the set fuel injection timing data on the ANG register 48. When the counter value becomes greater than or equal to the set fuel injection timing data, the comparator 54 output a comparator signal for triggering the fuel injection pulse outputting stage 46. The fuel injection pulse outputting stage includes a register 56. The fuel injection amount indicative data Ti representative of a fuel injection amount derived through execution of the program of FIG. 3 by the control unit, is to be set, which register will be hereafter referred to as "Ti register". A clock counter 58 is connected to the clock generator 52 to count clock pulses delivered therefrom, and a comparator 60 compares the counter value of the clock counter 58 with the set fuel injection amount indicative data Ti set on the Ti register 56. The comparator 60 as triggered by the comparator signal of the comparator 54 outputs a fuel injection pulse. This fuel injection pulse is outputted through an output port $O_{25}$ of the output interface 40, the output port being designed to be connected to a fuel injection valve in actual installation on the engine to drive the latter. When the counter value becomes greater than or equal to the set fuel injection timing data, the comparator 60 terminates the fuel injection pulse.

In inspection, the output port $O_{25}$ of the output interface 40 of the control unit 30 is connected to an input port $I_{15}$ of the input interface 20 of the inspection device 10. Therefore, the inspection device 10 receives the fuel injection pulse output through the output port $O_{25}$. Based on the inputs through the input ports $I_{14}$, the inspection device 10 derives a reference data Ti' corresponding to the fuel injection pulse to be generated and compares the reference data with the fuel injection pulse to check the control unit. Namely, the inspection device 10 compares the fuel injection pulse with the reference data Ti' to derive a difference therebetween and checks whether the obtained difference is within a predetermined acceptable range or not for making judgement whether the control unit 30 subjected to inspection is normal or not. The result of inspection is visibly indicated by an indicator 24 provided in the inspection device 10.

Practical process of inspection to be performed by the first embodiment of the inspection system set forth above will be discussed hereblow with reference to FIGS. 2 and 3.

After connecting respective output ports $O_{11}$, $O_{12}$ and $O_{13}$ and the input ports $I_{14}$ and $I_{15}$ to respective input ports $I_{21}$, $I_{22}$ and $I_{23}$ and output ports $O_{24}$ and $O_{25}$ of the control unit 30, the inspection program of FIG. 2 is triggered.

Initially, the first, second and third parameter data set in RAM 18 are read out and transferred through the output ports $O_{11}$, $O_{12}$ of the output interface 22 to the input ports $I_{21}$, $I_{22}$ and $I_{23}$ of the input interface 38 of the control unit 10, at a step 102. The control unit 30 is triggered by these parameter data for executing the program of FIG. 3. As will be seen from FIG. 3, the program to be executed by the control unit 30 is a normal fuel injection control program to be cyclically executed in actual fuel injection control.

As triggered, the control unit 30 derives a basic fuel injection amount Tp on the basis of the first and second parameter data N and Q according to the equation, at a step 202.

$$Tp = K \times Q/N$$

where K is a given constant value
Then, an engine driving condition dependent correction value COEF and a battery voltage compensation value Ts are derived at a step 204. In practical fuel injection control, the correction value COEF is derived on the various correction parameters, such as ignition switch position for engine start-up enrichment, engine acceleration demand for acceleration enrichment and so forth. However, in the inspection, only the third parameter data indicative of the engine coolant temperature Tw is input as the correction parameter, the correction value COEF is derived only based upon the third parameter data. The basic fuel injection amount Tp is corrected by the correction value COEF and the battery voltage compensation value Ts to derive a fuel injection amount Ti according to the following equation, at a step 206.

$$Ti = Tp \times COEF + Ts$$

At the step 206, the fuel injection amount Ti derived from the aforementioned equation is set in the Ti register 56.

The fuel injection amount Ti set in the Ti register 56 is transferred to the inspection device through the output port $O_{24}$ of the output interface 40 of the control unit 30 to the input port $I_{14}$. Transfer of the fuel injection amount Ti is triggered at a step 104 of the inspection program of FIG. 2. Then, the fuel injection amount data Ti thus read out is set in a register 56. Subsequently, a clock counter 58 is triggered in response to the leading edge of the fuel injection pulse output through the output port $O_{25}$ of the output interface 40 of the control unit and received through the input port $I_{25}$, at a step 106. The clock counter 28 may be a software timer and designed to count up internal clock for measuring the fuel injection pulse width. The counter value of the clock counter 58 is latched in response to the trailing edge of the fuel injection pulse. The counter value of the clock counter 58 thus obtained serves as the fuel injection pulse width indicative reference data Ti'.

At a step 108, the fuel injection amount data Ti set in the register 56 is compared with the reference data Ti' to obtain a difference between the compared data. At the step 108, the difference is compared with a predetermined threshold value which representative of the allowable maximum deviation between the fuel injection amount Ti and the reference data Ti'. When the difference is smaller than or equal to the threshold value, the indicator 24 is triggered to indicate that the control unit 30 subjected to inspection is "OK", at a step 110. On the other hand, when the difference is greater than the threshold value, the indicator 24 is triggered to indicate that the control unit 30 is no good (NG).

As will be appreciated from the discussion given hereabove, since the inspection system according to the present invention utilizes intermediate data derived during process of control operation by the control unit subjected to inspection. This intermediate data is then used by the inspection system for deriving a data to be compared with the output resultant value of the control unit derived by its control operation. Therefore, it is not necessary to preliminarily set the reference value to be compared with the output of the control unit. Furthermore, since the common data is used for producing the reference data and the output to check, accuracy of inspection can be obtained.

Although the aforementioned first embodiment of the inspection process may not detect fault in the software, software check can be performed by separately performed software check process, i.e. so-called ROM check.

Figure 5:
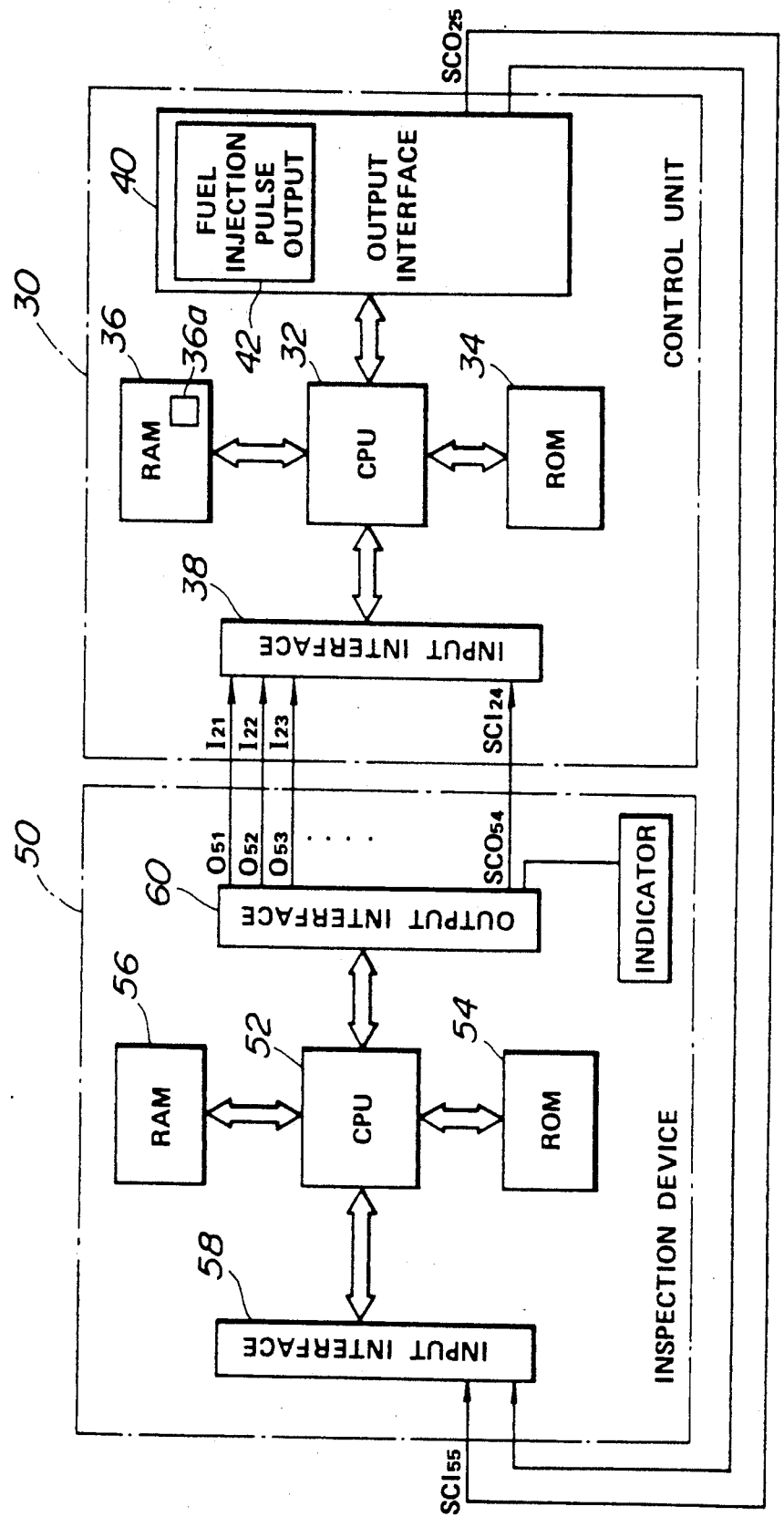
FIG. 5 is a block diagram of the second embodiment of an inspection system of a microprocessor based unit, according to the invention.

FIG. 5 shows the second embodiment of an inspection system according to the invention for checking the control unit. In this embodiment, an inspection device 50 comprises a microprocessor including CPU 52, ROM 54, RAM 56, an input interface 58 and an output interface 60. ROM 54 stores a plurality of inspection programs. The feature of the shown embodiment is that the inspection programs stored in ROM 54 is designed to be executed by the control unit 70 to be subject inspection.

Similarly to the former embodiment, the output interface 60 has output ports $O_{51}$, $O_{52}$, $O_{53}$ ... for outputting engine speed N indicative first parameter data, engine load indicative second parameter data and engine coolant temperature indicative parameter data. In addition, the output interface 60 has a serial data output port $SCO_{54}$. The inspection programs stored in ROM 54 is transferred through this serial data output port $SCO_{54}$.

The control unit subjected to inspection is substantially the identical construction as discussed with respect to the former embodiment. Therefore, discussion for respective components of the control unit 30 will not be given in detail and will be represented by the same reference numerals to the former embodiment. In addition to the input ports $I_{21}$, $I_{22}$ and $I_{23}$ which are concerned to the output ports $O_{51}$, $O_{52}$ and $O_{53}$ of the output interface 60 to receive the first, second and third parameter data, a serial data input port $SCI_{24}$ is provided. The serial data input port $SCI_{24}$ is connected to the serial data output port $SCO_{54}$ of the inspection device 50. On the other hand, the output interface 40 is provided a serial data output port $SCO_{25}$ which is connected to a serial data input port $SCI_{55}$ of the input interface 58 of the inspection device.

Each inspection program stored in ROM 54 is read out by one in order and transferred through the serial data output port $SCO_{54}$ and the serial data input port $SCI_{24}$ as a serial data and temporarily stored in a back-up memory section 36a of RAM 36. Each inspection program includes transfer completion indicative signal at the end of the program. The inspection program stored in RAM 36 is triggered in response to the transfer completion indicative signal to perform programmed inspection.

The inspection programs are respectively designed for checking specific components of the control unit. For example, one of the inspection programs is designed for detecting abnormality in the input system to receive engine speed indicative parameter, such as a crank angle sensor signal. In case that the crank reference signal is used as the engine speed indicative parameter, the control unit 30 reads the crank reference signal to derive the engine speed data N received through the input port $I_{21}$ and output the engine speed data through the serial data output port $SCO_{25}$. Therefore, the inspection program designed for checking the input system of the engine speed data processes the crank reference signal to derive the engine speed data and to output this data through the serial data output port. The inspection device compares the engine speed data received from the control unit 30 via the serial data output port $SCO_{25}$ and the serial data input port $SCI_{55}$ with a reference value indicative of the possible engine speed to be derived on the basis of the crank reference signal frequency represented by the firs parameter data. When the engine speed data matches the reference value, judgement is made that the engine speed data input system is in normal condition.

The process of inspection to be performed by the second embodiment of the inspection system will be discussed herebelow with reference to FIG. 6.

The inspection device initially transfer one of the inspection programs corresponding to the component of the control unit 30 to be checked, as triggered, at a step 302. Completion of transfer of the desired inspection program is detected by the inspection device by detecting the transfer completion signal, at a step 304. Then, the inspection device outputs an inspection command to the control unit 30 through the serial data output port $SCO_{54}$ and the serial data input port $SCI_{24}$, at a step 306. By the inspection command, the control unit 30 is triggered to execute inspection program. As triggered, the control unit 30 receives one of the parameter data corresponding to the inspection program to be executed through one of the input ports $I_{21}$, $I_{22}$ and $I_{23}$ and processes the received parameter data according to the inspection program. The control unit 30 outputs the results of the process through the serial data output port $SCO_{25}$.

The output of the control unit 30 is received by the inspection device 50 through the serial data input port $SCI_{55}$. The inspection device 50 compares the received output of the control unit with a reference value which represents a normal value to be derived on the basis of the parameter data input, at a step 308. When the output matches the reference value as checked at the step 308, judgement is made that the control unit 30 is normal. Then, indication that the control unit is "OK", is made on an indicator 62, at a step 310. On the other hand, when the output does not match the reference value, the indicator 62 indicates that the control unit is "NG", at a step 312.

After the step 310 or 312, check is performed whether the all of the inspection programs are performed, at a step 314. If not, process returns to the step 302 to perform next inspection program. When all of the inspection programs are performed, process goes END.

As will be appreciated herefrom, it is possible to perform the inspection not only utilizing the inspection program for checking the component of the control unit, but also utilizing the control program installed in the control unit. In case that the control program is used for inspection, the process to perform the inspection would be substantially same as that discussed with respect to the former embodiment.

According to the shown second embodiment, since the inspection program can be designed in any way and can be loaded to the control unit upon checking, the memory capacity for storing the inspection program in the control unit can be significantly reduced. Furthermore, since the inspection program can be specifically designed for performing inspection of each component, inspection time for each component can be minimized.

Furthermore, when the specification of the control unit is modified, modification of only inspection programs influenced by the modification of the specification of the control unit becomes necessary.

It should be noted that through the shown embodiment utilizes serial data for transferring data between the inspection device and the control unit, it may be possible to employ parallel data transfer system for transferring the data. Utilizing of the serial data may require only respective port for the inspection device and the control unit and thus maintain the cost of a low inspection device and the control unit. On the other hand, utilizing the parallel data may reduce period of time required for inspection.

While the present invention has been disclosed in terms of the preferred embodiment in order to facilitate better understanding of the invention, it should be appreciated that the invention can be embodied in various ways without departing from the principle of the invention. Therefore, the invention should be understood to include all possible embodiments and modifications to the shown embodiments which can be embodied without departing from the principle of the invention set out in the appended claims.

What is claimed is:

1. An inspection system for a microprocessor based unit comprising:

first means for storing an inspection program and inspection parameter data to be used for inspection of said microprocessor based unit;

second means for loading said program and said inspection data for executing inspection operation from said inspection system to said microprocessor based unit, said second means further outputting said inspection data to said microprocessor based unit for triggering the operation of said microprocessor based unit;

third means for inputting intermediate data which are generated by said microprocessor based unit based on said inspection data inputted to said microprocessor unit, said third means deriving reference data based on said intermediate data and said inspection data; and fourth means for receiving resultant data, said resultant data being derived through the operation of said microprocessor based unit using said intermediate data and inspection data, said fourth means compares said resultant data with said reference data in order to detect operational fault in said microprocessor based unit by detecting a difference between said resultant data and said reference data, operational fault being determined when said difference falls outside a predetermined range.

2. An inspection system as set forth in claim 1, wherein said microprocessor based unit forms a control unit which is connected to a control load for outputting a control signal having a value in a known relationship with an input representative of a control parameter, said inspection data at least stores data indicative of a value corresponding to said control parameter, and said third means reads said intermediate data which are derived during a process of derivation of said control signal and having a known relationship with said control signal.

3. An inspection system as set forth in claim 2, wherein said microprocessor based unit has an input port to receive therethrough said control parameter, a first output port connected to said control load to output said control signal therethrough, said first means is connected to said input port for inputting said control parameter corresponding inspection data therethrough, said fourth means is connected to said first output port for receiving said resultant data indicative of said control signal therethrough, and said microprocessor based unit further has a second output port for outputting said intermediate data therethrough, to which said third means is connected to receive therefrom said intermediate data.

4. An inspection system as set forth in claim 3, wherein said control signal derives a control magnitude of said control load on the basis of the input data input through said input port form said first means and said control signal drives said control load for a controlled magnitude based on said control magnitude, and said third means receives a signal indicative of said control magnitude for deriving said reference data representative of a control signal value which is to be derived by said control unit operating in normal condition.

5. A system as set forth in claim 1, wherein said inspection parameter data simulate an actual operating condition of said microprocessor based control unit.

6. An inspection system for a microprocessor based control unit for controlling a predetermined electrically or electronically controlled device based on a predetermined control parameter inputted to said microprocessor based control unit, comprising:

first means for storing an inspection program and dummy parameter data corresponding to said control parameter and having a known set of values;

second means for outputting said program and said dummy parameter data stored in said storing means to said microprocessor based control unit for triggering said microprocessor based control unit to perform operation for controlling a control load on the basis of said dummy parameter data;

third means for inputting intermediate data generated by said microprocessor based control unit based on said dummy parameter data inputted to said microprocessor unit during derivation of a control signal, said intermediate data being related to said control signal, said third means deriving reference data based on said intermediate data and said dummy parameter data;

fourth means for receiving said control signal from said microprocessor based control unit and comparing said control signal with said reference data in order to detect faulty operation of said microprocessor based control unit by detecting a difference between said control signal and said reference data, a fault indicating signal unit being determined when the difference between said control signal and said fault indicating signal falls outside a predetermined range; and fifth means, responsive to said fault indicating signal, for outputting a signal indicative of said fault indicative signal.

7. An inspection system as set forth in claim 6, wherein said microprocessor base control unit has an input port to receive therethrough said control parameter, a first output port connected to said control load to output said control signal therethrough, said first means is connected to said input port for inputting said control parameter corresponding inspection data therethrough, said fourth means is connected to said first output port for receiving said control signal therethrough, and said microprocessor based unit further has a second output port for outputting said intermediate data therethrough, to which said third means is connected to receive therefrom said intermediate data.

8. An inspection system as set forth in claim 7, wherein said control signal derives a control magnitude of said control load on the basis of the input data input through said input port from said first means and said control signal drives said control load for a controlled magnitude based on said control magnitude, and said third means receives a signal indicative of said control magnitude for deriving said reference data representative of a control signal value which is to be derived by said control unit operating in normal condition.

9. A system as set forth in claim 6, wherein said first means stores a plurality of inspection programs, a selected one of said plurality of inspection programs being downloadable into said microprocessor based control unit.

10. An inspection system for a microprocessor based unit, comprising:

first means for storing an inspection program to be executed by said microprocessor based unit, and for storing inspection parameter data of a known value corresponding to control parameters, said inspection program being programmed to derive resultant data in a known relationship with said parameter data;

second means for reading and loading said inspection program and said inspection parameter data into said microprocessor based unit, said second means triggering said microprocessor based unit to executed said inspection program;

third means for inputting intermediate data generated by said microprocessor based unit based on said inspection parameter data inputted to said microprocessor based unit, said third means deriving reference data based on said intermediate data and said inspection parameter data;

fourth means for receiving said resultant data derived through the operation of said microprocessor based unit using said intermediate data and said inspection parameter data and for comparing said resultant data with said reference data in order to detect faulty operation of said microprocessor based unit by measuring the arithmetic relationship between said resultant data and said reference data and outputting a fault indicative signal when said arithmetic relationship is other than a known relationship; and fifth means, responsive to said fault signal, for outputting a signal indicative of said faulty operation.

11. An inspection system as set forth in claim 10, wherein said first means outputs the inspection parameter data indicative of normal condition of said microprocessor based unit.

12. An inspection system as set forth in claim 11, wherein said first means stores a plurality of inspection programs to be loaded and executed by said microprocessor based unit to check a plurality of components of said microprocessor based unit.

13. An inspection system as set forth in claim 12, wherein said first means stores an inspection control program governing loading and execution of said inspection programs.

14. A system as set forth in claim 10, wherein said inspection parameter data simulate an actual operating condition of said microprocessor based control unit.

15. A system as set forth in claim 10, wherein said first means stores a plurality of inspection programs, a selected one of said plurality of inspection programs being downloadable into said microprocessor based control unit.

16. A method for inspecting a microprocessor based unit comprising the steps of:
  storing inspection parameter data of a known value corresponding to control parameters and an inspection program to be used for inspection of said processor based unit in an inspection microprocessor means, said inspection program being programmed to derive resultant data in a known relationship with said inspection parameter data;
  loading said inspection parameter data and said program into said microprocessor based unit for triggering operation of said microprocessor based unit;
  generating intermediate data by running said inspection parameter data through the operation of said microprocessor based unit;
  loading said intermediate data to said inspection microprocessor means;
  separately deriving reference data of known relationship based on said intermediate data and said inspection data in said inspection microprocessor means;
  deriving said resultant data by operating through said microprocessor based unit using said intermediate data and said inspection parameter data; and
  comparing said resultant data with said reference data to detect fault in said operation of said microprocessor based unit by detecting a difference between said resultant data and said reference data, fault being determined when said difference falls outside a predetermined range.

17. A method as set forth in claim 16, wherein said microprocessor based unit forms a control unit for connecting to a control load for outputting a control signal having a value in a known relationship with an input representative of a control parameter, said control signal is indicative of a value corresponding to said control parameter, and said intermediate data are derived during a process of derivation of said control signal and having a known relationship with said control signal.

18. A method as set forth in claim 17, wherein a control magnitude indicative value is derived on the basis of the input representative of a control parameter and said control signal for driving said control load for a controlled magnitude based on said control magnitude, and said reference data is derived on the basis of said control magnitude in such a manner that is representative of a control signal value which is to be derived by said control unit operating in normal condition.

19. A method as set forth in claim 16, further including the step of selecting an inspection program from a plurality of stored inspection programs.

20. A method as set forth in claim 16, wherein said inspection parameter data simulate actual operating condition of said microprocessor based unit.

21. A method for inspecting a microprocessor based unit comprising the steps of:
  storing an inspection program to be executed by said microprocessor based unit and inspection parameter data corresponding to said inspection program in an inspection microprocessor means, said data having a known value, and said inspection program being programmed to derive resultant data related to said parameter data;
  loading said inspection program and said parameter data into said microprocessor based unit;
  triggering operation of said microprocessor based unit according to said parameter data to execute said inspection program, said parameter data acting as an dummy input simulating actual operation parameter data of said microprocessor based unit;
  generating intermediate data by running said inspection parameter data through the operation of said microprocessor based unit;
  loading said intermediate data to said inspection microprocessor means;
  separately deriving reference data of known relationship based on said intermediate data and said inspection data in said inspection microprocessor;
  deriving said resultant data by operating through said microprocessor based unit using said intermediate data and said inspection parameter data; and
  comparing said resultant data with said reference data to detect faulty operation of said microprocessor based unit by detecting a difference between said resultant data and said reference data, a fault indicative signal being detected when said difference falls outside a predetermined range; and
  indicating fault in said microprocessor based unit in response to a detection of said fault indicative signal.

22. An inspection system as set forth in claim 21, wherein said inspection program outputs said inspection parameter data indicative of normal condition of said microprocessor based unit.

23. An inspection system as set forth in claim 22, further comprising the step of storing a plurality of inspection programs to inspect a plurality of components of said microprocessor based unit.

24. A method as set forth in claim 23, wherein the loading and execution of said inspection programs is governed, by an inspection control program.

25. An inspection system for a microprocessor based control unit which receives a control parameter input, processes the received control parameter for performing a first arithmetic operation through which intermediate data are derived on the basis of said control parameter input and further performing a second arithmetic operation for processing said intermediate data to derive a control signal to be outputted for controlling an associated control load, said inspection system comprising:
  a microprocessor;
  a data storage incorporated in said microprocessor, in which dummy parameter data simulating the control parameter input are stored;

a first port connectable with an input port of said control unit for transferring said control parameter input simulated dummy parameter data;

a second port connectable with an output port of said control unit through which said intermediate data are transferred, for receiving the intermediate data, in which said intermediate data represent a control value; and a third port connectable with another output port of said control unit for receiving said control signal output therefrom, wherein said microprocessor compares a reference value derived on the basis of said control value of said intermediate data with said control signal received through said third port and said reference data to detect failure of said control signal when a difference of said control signal and said reference data is greater than a predetermined value.

26. A system as set forth in claim 25, wherein said data storage stores a plurality of inspection programs, a selected one of said plurality of inspection programs being downloadable into said microprocessor based control unit.

27. An inspection system for a microprocessor based control unit which receives a control parameter input, processes the received control parameter for performing a first arithmetic operation through which intermediate data are derives on the basis of said control parameter input and further performing a second arithmetic operation for further processing said intermediate data to derive a control signal to be outputted for controlling an associated control load, said inspection system comprising:

a microprocessor;

a data storage incorporated in said microprocessor, in which at least one inspection program which performs a predetermined inspection is stored and inspection parameter data for loading into said control unit;

said microprocessor externally connectable with said control unit to allow said loading of said inspection program and said inspection parameter data to said control unit and to allow triggering of said inspection program in said controller, and for receiving data from said control unit for checking operation of said control unit, wherein said control unit derives said intermediate data by running said inspection parameter data and derives resultant data by performing said second arithmetic operation for further processing said intermediate data and said inspection parameter data;

wherein said microprocessor independently derives reference data by performing an arithmetic operation substantially identical to that of said second arithmetic operation by using said intermediate data derived by said control unit and said inspection parameter data; and wherein said microprocessor compares said reference data derived by said microprocessor with said resultant data derived by said control unit.

28. A system as set forth in claim 27, wherein said data storage stores a plurality of inspection programs, a selected one of said plurality of inspection programs being downloadable into said microprocessor based control unit.

* * * * *